United States Patent
Van Steenwinckel et al.

(10) Patent No.: US 7,897,323 B2
(45) Date of Patent: Mar. 1, 2011

(54) LITHOGRAPHIC METHOD

(75) Inventors: David Van Steenwinckel, Holsbeek (BE); Peter Zandbergen, Hechtel-Eksel (BE)

(73) Assignee: NXP B.V., Eindhoven (NL)

( * ) Notice: Subject to any disclaimer, the term of this patent is extended or adjusted under 35 U.S.C. 154(b) by 587 days.

(21) Appl. No.: 11/720,315

(22) PCT Filed: Nov. 10, 2005

(86) PCT No.: PCT/IB2005/053700
§ 371 (c)(1),
(2), (4) Date: May 25, 2007

(87) PCT Pub. No.: WO2006/056905
PCT Pub. Date: Jun. 1, 2006

(65) Prior Publication Data
US 2008/0131820 A1    Jun. 5, 2008

(30) Foreign Application Priority Data
Nov. 25, 2004  (GB) .................... 0425864.6
Mar. 31, 2005  (EP) .................... 05102563

(51) Int. Cl.
*G03F 7/26* (2006.01)

(52) U.S. Cl. ..................................... 430/322

(58) Field of Classification Search ................ 430/322, 430/325
See application file for complete search history.

(56) References Cited

U.S. PATENT DOCUMENTS

| | | | |
|---|---|---|---|
| 6,338,934 B1 * | 1/2002 | Chen et al. | 430/270.1 |
| 6,534,243 B1 | 3/2003 | Templeton et al. | |
| 2006/0040213 A1 * | 2/2006 | Aizenberg et al. | 430/312 |

* cited by examiner

*Primary Examiner*—Kathleen Duda
*Assistant Examiner*—Brittany Raymond

(57) ABSTRACT

A method of achieving frequency doubled lithographic patterning is described. An optical pattern (16) having a first period ($p_1$) is used to expose conventional acid-catalysed photoresist (18) on substrate (20), leaving regions of high exposure (24), regions of low exposure (26) and intermediate regions (22). Processing proceeds leaving regions (24) which received high exposure very polar, i.e. hydrophilic, regions (26) of low exposure very apolar, i.e. hydrophobic, and the intermediate regions having intermediate polarity. A developer of intermediate polarity such as propylene glycol methyl ether acetate is then used to dissolve only the intermediate regions (22) leaving photoresist patterned to have a pitch ($p_2$) half that of the optical period ($p_1$). Alternatively, the photoresist is removed from the apolar and polar regions leaving only the intermediate regions (22) again with the same pitch ($p_2$) half that of the optical period ($p_1$).

7 Claims, 1 Drawing Sheet

LITHOGRAPHIC METHOD

Figure 1:
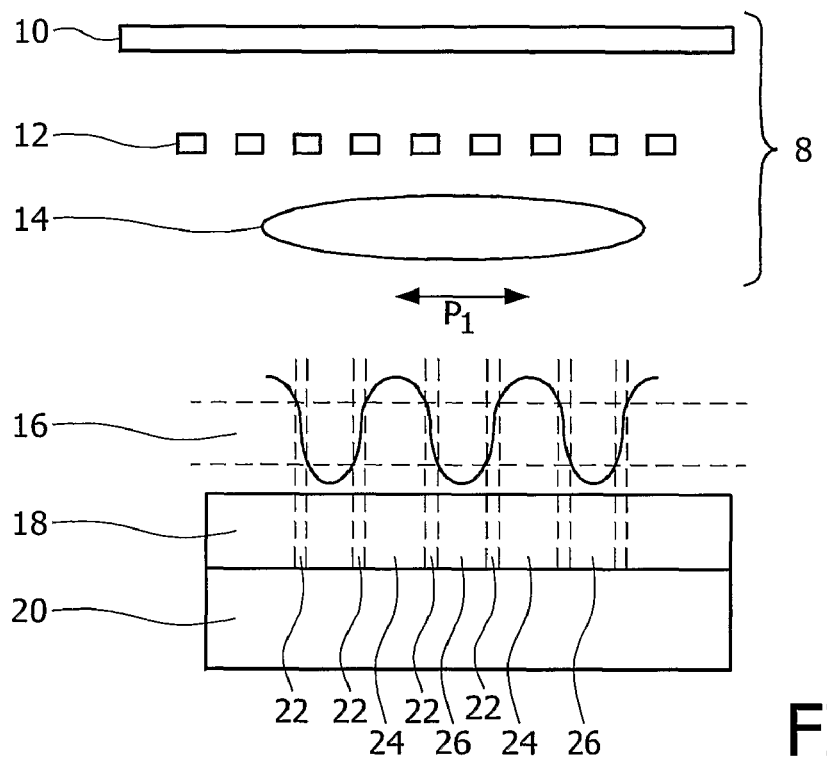

The invention relates to a lithographic method, and particularly to a lithographic method suitable for defining very small features at large packing densities.

Optical lithography is most commonly used to pattern semiconductors, since the fine details achievable using modern optical lithography systems are well suited to semiconductor manufacture. However, the approach can be used in other technology fields as well, including nanotechnology, the manufacture of diffraction gratings, or indeed any field in which fine patterns are required.

There is a continuing demand to pattern smaller and smaller features. In lithography, the smallest pitches that can be printed by an optical imaging system are limited by the optical resolution of the imaging system. In general, the smallest pitch p at which features can be printed is defined by the equation:

$$p/2 = k_1 \lambda / NA$$

where NA is the numerical aperture of the imaging system, $\lambda$ is the wavelength of the light used in the imaging system and $k_1$ is a process-dependent constant that reflects everything about the lithography process apart from the wavelength and numerical aperture. The diffraction-limited minimum value of $k_1$ is 0.5 for coherent light.

For dense features in which the line:space ratio is 1:1 the resolution R is given by p/2, i.e.

$$R = p/2 = k_1 \lambda / NA.$$

A number of approaches to minimise p are possible. One approach is to minimise the wavelength $\lambda$ of the light used, and this has led to the development of imaging systems using short wavelength ultra-violet light or even x-rays. Another approach is to reduce $k_1$, for example by using incoherent light, off-axis illumination or phase-shift masks. Using such techniques, the value of $k_1$ is reduced towards its theoretical minimum value of 0.25.

A difficulty with systems with low values of $k_1$ is that the light from the optical modulation system will not have a hard edge. In general, only the lowest diffraction order pattern is captured by the lens in the optical imaging system and this means that the modulation of the light across the surface of the substrate to be printed is essentially sinusoid.

The actual patterning may be achieved using a photoresist system which reacts to the light to release acid proportional to the incident exposure dose. In a conventional photoresist system, a photoresist polymer is exposed to light and then subjected to a post-exposure bake, for example 90 s at 120° C. At this temperature an acid-catalysed reaction takes place in which apolar groups on the backbone of the polymer are removed, rendering the polymer more polar. The extent to which this reaction takes place varies with the amount of acid formed inside the resist during the optical exposure step, which is in turn proportional to the incident exposure dose. As a result, the polarity of the resist is a function of the optical exposure.

To develop the photoresist, an aqueous base developer dissolves only the exposed photoresist in regions where sufficient chemical change from non-polar to polar groups has been achieved. Above a certain threshold exposure, the polymer becomes sufficiently polar to dissolve in the developer over the time of the development step. In this way, one pattern in the photoresist per optical period may be achieved.

A number of methods have been proposed to pattern features at a smaller pitch than this by achieving more than one feature per optical period.

US2003/0031956 produces two features per optical period by patterning features twice, shifting the mask by a very small amount between each patterning step. However, such very small shifts, by less than the optical period are very difficult to achieve reliably.

An alternative approach is described in U.S. Pat. No. 6,534,243. In this approach, resist is formed and patterned, leaving resist regions and gaps between the resist region. A coating is formed over the whole surface. A "deprotection region" is then formed in the remaining resist and removed, leaving two features. However, the process for forming the "deprotection" region requires a further unmasked exposure after forming the resist regions and makes use of differential properties of the photoresist at the edges of the resist and in the centre of the resist using hydroxide ions in the coating which diffuse into the edges of the resist mopping up acid generated but not into the central deprotection region. Accordingly, process control in this process may be difficult.

A further option is the hybrid resist described in U.S. Pat. No. 6,338,934. This describes the use of a photoresist with both a photo-acid generator (PAG) and a photo-base generator (PBG). For example, the PAG may release an acid above a certain threshold dose (D1) and the PBG would release a quencher molecule above a second threshold dose (D2) with D2>D1. In this way, the enhanced solubility of resist is achieved for intermediate exposures. Thus, when exposed by a sinusoidal pattern of light intensity, the peaks and troughs are soluble and the intermediate regions insoluble thereby leading to frequency doubling. U.S. Pat. No. 6,338,934 describes a further refinement, and that is that the photoresist can be used either as negative or positive photoresist.

However, this approach requires the use of a complicated photoresist including a photochemically activated quenching agent.

There thus remains a need for an improved lithographic method.

According to the invention there is provided a method of lithographic patterning, comprising:

applying a photoresist to a surface to be patterned, exposing the photoresist using optical radiation through a mask pattern and carrying out a post-exposure bake, wherein with increasing optical exposure the photoresist changes from being apolar to polar or vice versa through a stage of intermediate polarity, the exposure step resulting the photoresist having polar regions, apolar regions, and regions of intermediate polarity; and developing the photoresist to remove the photoresist either from the regions of intermediate polarity or from both the polar regions and the apolar regions, to leave photoresist in the other of the regions of intermediate polarity or both the polar regions and the apolar regions.

The method according to the invention has a similar result to that said to be achieved using the approach of U.S. Pat. No. 6,338,934. However, in U.S. Pat. No. 6,338,934, the method requires the use of a special hybrid photoresist. In contrast, the invention can use a standard photoresist and achieves the same result more simply by using a developer of intermediate polarity.

In an embodiment, the developing step includes developing the photoresist using a developer of intermediate polarity between the polarity of the photoresist in its apolar and polar states to preferentially dissolve the photoresist of intermediate polarity leaving the polar regions and the apolar regions of the photoresist over the surface to be patterned.

In an alternative embodiment the step of developing the photoresist includes:

developing the photoresist using a developer of high polarity to dissolve the photoresist in the polar regions; and developing the photoresist using a developer of low polarity to dissolve the photoresist in the apolar regions, either before or after using a developer of high polarity;

leaving photoresist in the regions of intermediate polarity over the surface to be patterned.

The photoresist may be exposed through a mask pattern defining an optical modulation across the surface to be patterned of a first predetermined pitch and the step of developing the photoresist may result in photoresist having a second predetermined pitch being substantially half the first predetermined pitch.

In an embodiment the developer of intermediate polarity is propylene glycol methyl ethyl acetate. Alternative developers may also be used if required.

The photoresist may be of acid-catalyzed type. Alternative types of photoresist are also possible, including Novolak-type photoresist.

Figure 2:
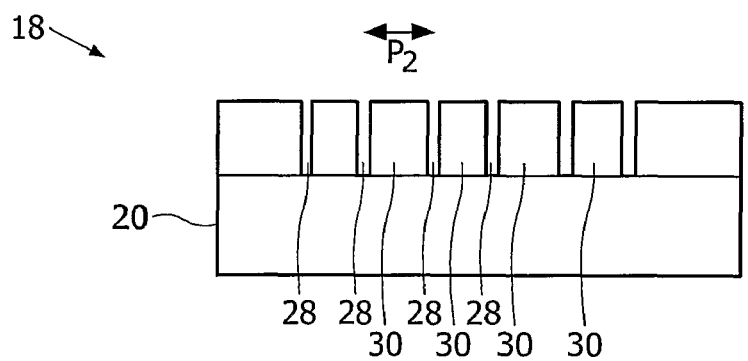
Figure 3:
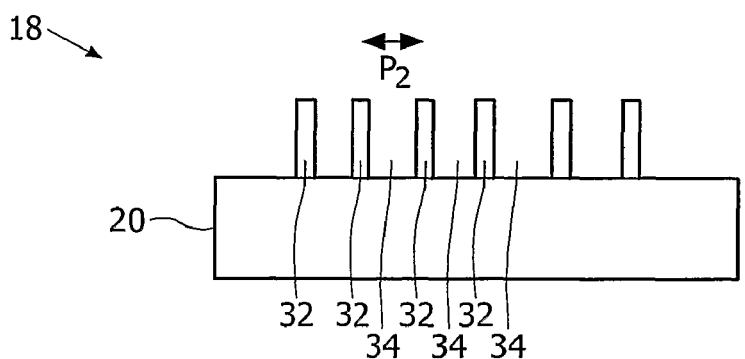

For a better understanding of the invention, an example will now be described, purely by way of example, with reference to the accompanying drawings, in which:

FIG. 1 illustrates a first processing step of a method according to the invention; and FIG. 2 illustrates a second processing step of a method according to a first embodiment of the invention; and FIG. 3 illustrates the second processing step of a method according to a second embodiment of the invention.

As shown highly schematically in FIG. 1, an optical system 8 includes a diffuse source of light 10, a mask 12 and an optical imaging system 14 here represented by a lens. As the skilled person will appreciate, the imaging system will in practice be more complicated than represented here but these additional details are well known in the art and so will not be presented further.

The optical system creates a pattern of light 16 across the surface of acid-catalysed type photoresist 18 on substrate 20, here a semiconductor substrate 20. The exposure varies essentially sinusoidally across the substrate caused by the first order image of the mask 12, which here consists of regularly spaced lines. The intensity varies sinusoidally across the surface with a pitch $p_1$.

The exposure thus creates areas of high exposure 24 in which the exposure is above first threshold 32, areas of low exposure 26 in which the exposure is below a second threshold 34, and areas of intermediate exposure 22 between the areas of high and low exposure 24,26.

It is the pitch of the sinusoidal intensity variation $p_1$ that has an optical limit given by $p_1/2=k_1\lambda/NA$ where $k_1$ has a theoretical minimum value of 0.25.

After exposure, the semiconductor substrate 20 and photoresist 18 are treated to a post-exposure bake, for example at 120° C. for about 90 s. At this temperature, an acid-catalysed chemical reaction takes place at which apolar lipophilic groups are removed from the polymer backbone. What remains on the polymer backbone are more polar hydrophilic groups.

The extent that this reaction takes place depends on the degree of exposure to light. Thus, in regions 24 of high exposure, the reaction takes place to a large extent leaving the photoresist substantially polar (hydrophilic). In regions 26 of low exposure, the reaction takes place to a small extent leaving the photoresist substantially apolar (hydrophobic). In the intermediate regions 22, the photoresist is rendered of intermediate polarity.

This is the step reached shown in FIG. 1.

The samples are then developed using a developer of intermediate polarity, which matches the polarity of the intermediate regions. The developer dissolves the intermediate regions, leaving gaps 28 between regions 30 where the photoresist remains, formed of the regions 26 of low exposure as well as the regions 24 of high exposure, as shown in FIG. 2.

Patterning of the substrate 20 can then proceed in the usual way.

The pitch achieved $p_2$ is half the pitch $p_1$ of the optical pattern. In this way, the pattern of photoresist is of double the frequency of the optical pattern. It is thereby even possible to achieve pitches $p_2$ of less than the theoretical minimum for the frequency of the optical pattern, using only a single development step.

In the above example, photoresist is removed from the regions of intermediate exposure 22. In a second embodiment, the photoresist is kept in the region of intermediate exposure 22 and removed from the region of high exposure 24 as well as the regions of low exposure 26 resulting in the photoresist structure of FIG. 3.

This is achieved as follows.

After the post-exposure bake, the samples are first developed in a high-polarity developer. This matches the polarity of the highly exposed regions 24, and so dissolves away these regions of photoresist leaving the regions of intermediate 22 and low 24 exposure still present.

Next, the samples are developed in a low-polarity developer which matches the polarity of the regions of low exposure 24 and so dissolves the photoresist from these regions, leaving photoresist only in the regions of intermediate exposure 22 as illustrated in FIG. 3. Processing of the samples can then continue as before; note that the photoresist pattern of FIG. 3 is essentially the negative of that of FIG. 2.

Although the above method is described with the high-polarity developer being used before the low-polarity developer, the order of the developers may be reversed if required.

In some cases it may be advantageous to use the approach of the method of FIG. 3 rather than the method of FIG. 2. For example, when using this approach, one of the high and low polarity developers used may be a standard developer.

The method of the invention need not be applied to semiconductor substrates but may be applied anywhere where small features are required, for example for nanotechnology or for making diffraction gratings.

In a specific example of the first embodiment, AR237J photoresist 18 from JSRMicro was deposited to a thickness of 280 nm on a substrate of silicon oxynitride (SiON) on silicon.

An optical signal was used to expose the photoresist with a repeating pattern of period 360 nm across the substrate.

A post exposure bake of 90 s at 120° C. was then applied.

Propylene glycol methyl ether acetate (PGMEA) was then used as a developer, the exposed sample being placed in the developer for a period of 60 s at 22° C. (room temperature).

This development step dissolved regions of photoresist that had been exposed with a dose from 0.9 arbitrary units (a.u.) to 2.2 a.u. Regions with higher or lower doses were dissolved at a much lower rate.

An electron micrograph was taken showing a pattern in the resist of periodicity 180 nm across the substrate. Thus, the pattern has half the period of the optical pattern.

A comparative example was run using a conventional process which resulted in a repeating pattern of period 360 nm across the sample.

Although the invention has been described for a particular type of photoresist, it is suitable for different types, including Novolak type resists, and it is also suitable for both positive and negative photoresists.

Alternative developers are also possible, and suitable combinations of developer and photoresist are required. For good results, the dissolution process during development should be thermodynamically favourable as well as kinetically rapid. The speed of reaction is best determined by experiment. Thermodynamics does however allow some determinations of suitable solvents.

Without wishing to be bound by theory, for a reaction to be thermodynamically favourable the change in Gibbs free energy $\Delta G$ should be small. Since $\Delta G = \Delta H - T\Delta S$ where H is the enthalpy, S the entropy, and T the temperature, and further since $\Delta S$ is small, suitable solvents will have $\Delta H$ for the dissolution process small to achieve the small change in Gibbs free energy.

Now, $\Delta H = f_s f_p (d_s - d_p)^2$, following an equation developed by Hildebrand, where $f_s$ and $f_p$ are the volume fractions of solvent and polymer respectively and $d_s$ and $d_p$ are the cohesive energy density for the solvent and polymer. Thus, for a favourable low $\Delta H$ $d_s$ and $d_p$ should have close values. Since the relevant state of the polymer is the intermediate state, a desirable photoresist and developer combination will have a $d_s$ value of the developer close to the $d_p$ value of the photoresist in the intermediate state, i.e. in its state of intermediate polarity.

Such $d_s$ and $d_p$ values for polymers and solvents may be found in published tables, and may be referred to as Hildebrand parameters, sometimes given the Greek character $\delta$.

Notwithstanding this theory, in practice kinetic effects are very important so the thermodynamic approach will not always suggest the best combinations of developer and photoresist, but can only suggest suitable candidates.

In practice therefore experiment may represent a good way to determine suitable combinations of developer and photoresist.

The invention claimed is:

1. A method of lithographic patterning, comprising:
  applying a photoresist to a surface to be patterned,
  exposing the photoresist using optical radiation through a mask pattern and carrying out a post-exposure bake, wherein with increasing optical exposure the photoresist changes from being apolar to polar or vice versa through a stage of intermediate polarity, the exposure step resulting the photoresist having polar regions, apolar regions, and regions of intermediate polarity; and
  developing the photoresist to remove the photoresist either from the regions of intermediate polarity or from both the polar regions and the apolar regions, to leave photoresist on the other of the regions of intermediate polarity or both the polar regions and the apolar regions.

2. A method according to claim 1 wherein the developing step includes developing the photoresist using a developer of intermediate polarity between the polarity of the photoresist in the apolar and polar regions to preferentially dissolve the photoresist of intermediate polarity leaving the polar regions and the apolar regions of the photoresist over the surface to be patterned.

3. A method according to claim 2 wherein the photoresist in its intermediate polarity state and the developer of intermediate polarity have Hildebrand cohesive energy densities that are sufficiently close to one another that the photoresist in its intermediate polarity state dissolves in the developer of intermediate polarity.

4. A method according to claim 1 wherein the developer of intermediate polarity is propylene glycol methyl ether acetate.

5. A method according to claim 1 wherein the step of developing the photoresist includes:
  developing the photoresist using a developer of high polarity to dissolve the photoresist in the polar regions; and
  developing the photoresist using a developer of low polarity to dissolve the photoresist in the apolar regions, either before or after using a developer of high polarity;
  leaving photoresist in the regions of intermediate polarity over the surface to be patterned.

6. A method according to claim 1 wherein in the step of exposing the photoresist the photoresist is exposed through a mask pattern defining an optical modulation across the surface to be patterned of a first predetermined pitch;
  wherein the step of developing the photoresist results in photoresist having a second predetermined pitch being substantially half the first predetermined pitch.

7. A method according to claim 1 wherein the photoresist is of acid-catalyzed type.

* * * * *